United States Patent
Kimura (10) Patent No.: US 7,956,679 B2
(45) Date of Patent: Jun. 7, 2011

(54) DIFFERENTIAL AMPLIFIER WITH OFFSET VOLTAGE TRIMMING

(75) Inventor: Hiroyuki Kimura, Sendai (JP)

(73) Assignee: Freescale Semiconductor, Inc., Austin, TX (US)

( * ) Notice: Subject to any disclaimer, the term of this patent is extended or adjusted under 35 U.S.C. 154(b) by 159 days.

(21) Appl. No.: 12/511,076

(22) Filed: Jul. 29, 2009

(65) Prior Publication Data

US 2011/0025419 A1 Feb. 3, 2011

(51) Int. Cl.
*H03F 1/02* (2006.01)
(52) U.S. Cl. .............................. 330/9; 330/257; 330/260
(58) Field of Classification Search .............. 330/9, 257, 330/260
See application file for complete search history.

(56) References Cited

U.S. PATENT DOCUMENTS

| | | | | |
|---|---|---|---|---|
| 4,147,971 A * | 4/1979 | Price | ............................. | 323/315 |
| 5,610,557 A * | 3/1997 | Jett, Jr. | ........................ | 330/261 |
| 6,194,962 B1 * | 2/2001 | Chen | ................................ | 330/9 |
| 6,285,258 B1 * | 9/2001 | Ikeuchi et al. | ................ | 330/288 |
| 7,049,889 B2 * | 5/2006 | Kalb | ............. | 330/253 |
| 7,339,775 B2 | 3/2008 | Kimura | | |
| 7,414,384 B2 | 8/2008 | Kimura | | |
| 7,518,453 B2 * | 4/2009 | Segarra | ........................ | 330/254 |
| 7,812,665 B2 * | 10/2010 | Eschauzier et al. | ............... | 330/9 |

| | | |
|---|---|---|
| 2008/0048626 A1 | 2/2008 | Kimura |
| 2008/0191673 A1 | 8/2008 | Kimura |
| 2008/0218223 A1 | 9/2008 | Kimura |
| 2008/0258696 A1 | 10/2008 | Kimura |

FOREIGN PATENT DOCUMENTS

| | | |
|---|---|---|
| JP | 10112617 A | 4/1998 |
| JP | 2008067188 A | 3/2008 |

* cited by examiner

*Primary Examiner* — Patricia Nguyen
(74) *Attorney, Agent, or Firm* — Charles Bergere (57) ABSTRACT

A differential amplifier that has a current supply and a differential current to voltage converter with a positive current input node, a negative current input node and a voltage output node, has offset voltage trimming. The voltage output node provides an output voltage that is proportional to the difference in current values flowing into the positive current input node and a negative current input node. A trimming circuit has a plurality of trimming control inputs, an inverting trimming output, a non-inverting trimming output and trimming inputs coupled to the current supply. Trimming resistances couple the inverting trimming output to the non-inverting trimming output. Trimming selectors, controllable by a trim code provided to the trimming control inputs, provide for selectively connecting the current supply directly to the non-inverting trimming output while selectively connecting the current supply to the inverting trimming output through a first selected group of the trimming resistances. The differential amplifier also has a differential transistor pair formed by an inverting transistor that couples the inverting trimming output to the positive current input node and a non-inverting transistor that couples the non-inverting trimming output to the negative current input node.

20 Claims, 11 Drawing Sheets

| VP- VN | B2 | B1 |
|--------|----|----|
| 300mv  | 0  | 0  |
| 100mv  | 0  | 1  |
| -100mv | 1  | 0  |
| -300mv | 1  | 1  |

DIFFERENTIAL AMPLIFIER WITH OFFSET VOLTAGE TRIMMING

BACKGROUND OF THE INVENTION

The present invention relates to a differential amplifier with offset voltage trimming and a method for offset voltage trimming. The invention is particularly useful for automatic offset voltage trimming of a differential amplifier that supplies an output voltage to control a voltage dependent load such as a Voltage Controlled Oscillator (VCO).

Differential amplifiers, typically operational amplifiers, often have an offset voltage at the amplifier's output caused by component value imbalances primarily resulting from temperature drift. Such offset voltages are undesirable especially when highly accurate output voltages are required, for instance, when used for controlling a VCO. One solution for trimming (reducing) the offset voltage involves canceling the offset voltage with another voltage of the same magnitude and opposite polarity. This solution, in its simplest form, involves inserting a variable resistance into the inverting input path of the amplifier. However, the exact magnitude and polarity of the offset voltage may vary due to temperature drift and thus the variable resistance may need to be adjusted frequently. Further, the insertion of the variable resistance into the inverting input path can affect the gain of the amplifier.

Another solution for trimming offset voltages includes selectively inserting resistors into the paths of differential transistor pairs that are part of the amplifier's internal circuitry. However, this solution also affects the gain of the amplifier, which may not be suitable for specific applications.

Accordingly, it would be advantageous to have a differential amplifier that produces a highly accurate output voltage, and to be able to trim an offset voltage without adversely affecting amplifier gain.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that device components and method steps that comprises a list of elements or steps does not include only those elements but may include other elements or steps not expressly listed or inherent to such device components or steps. An element or step proceeded by "comprises . . . a" does not, without more constraints, preclude the existence of additional identical elements or steps that comprises the element or step.

In one embodiment, the present invention provides a differential amplifier with offset voltage trimming comprising at least one current supply and a differential current to voltage converter. The differential current to voltage converter has a positive current input node, a negative current input node and a voltage output node. In operation, the voltage output node provides an output voltage that is proportional to the difference in current values flowing into the positive current input node and a negative current input node. There is an offset voltage trimming circuit that has a plurality of trimming control inputs, an inverting trimming output, a non-inverting trimming output and at least two trimming inputs coupled to the at least one current supply. The offset voltage trimming circuit further includes a plurality of trimming resistances coupling the inverting trimming output to the non-inverting trimming output, and a plurality of trimming selectors. The trimming selectors, that are controllable by a trim code provided to the trimming control inputs, provide for selectively connecting the current supply directly to the non-inverting trimming output whilst selectively connecting the current supply to the inverting trimming output through a first selected group of the trimming resistances. There is a differential transistor pair formed by an inverting transistor that couples the inverting trimming output to the positive current input node and a non-inverting transistor that couples the non-inverting trimming output to the negative current input node.

In another embodiment, the present invention provides a differential amplifier with offset voltage trimming comprising at least one current supply for providing a supply current. There is a differential current to voltage converter having a positive current input node, a negative current input node and a voltage output node. The voltage output node provides an output voltage that is proportional to the difference in current values flowing into the positive current input node and a negative current input node. The differential amplifier with offset voltage trimming also includes an offset voltage trimming circuit having a plurality of trimming control inputs, two trimming outputs and at least two trimming inputs coupled to the at least one current supply. The offset voltage trimming circuit further includes a plurality of trimming resistances coupling the inverting trimming output to the non-inverting trimming output, and a plurality of trimming selectors. The trimming selectors, that are controllable by a trim code provided to the trimming control inputs, provide for selectively connecting portions of the supply current to each of the trimming outputs through none or alternatively through at least one of the trimming resistances. There is a differential transistor pair formed by an inverting transistor that couples one of trimming outputs to the positive current input node and a non-inverting transistor that couples another one of the trimming outputs to the negative current input node.

In yet another embodiment, the present invention provides a method for providing offset voltage trimming for a differential amplifier. The differential amplifier has an offset voltage trimming circuit with two trimming outputs coupled to respective transistors forming a differential transistor pair and two trimming inputs coupled to the at least one current supply. The differential amplifier also has a plurality of trimming resistances for selectively coupling the two trimming outputs to the current supply, a plurality of trimming control inputs, a non-inverting input, an inverting input and a voltage output node coupled to the inverting input. The method includes providing an input voltage to the non inverting input and determining an offset voltage from a difference between the control voltage and a feedback voltage at the inverting input. The method performs selecting a binary trim code, from a trimming code look up table, that corresponds to the offset voltage. The method then performs applying the binary trim code, to the trimming control inputs, to selectively connect portions of the supply current to each of the trimming outputs through none or alternatively through at least one of the trimming resistances thereby reducing the offset voltage.

Figure 1:
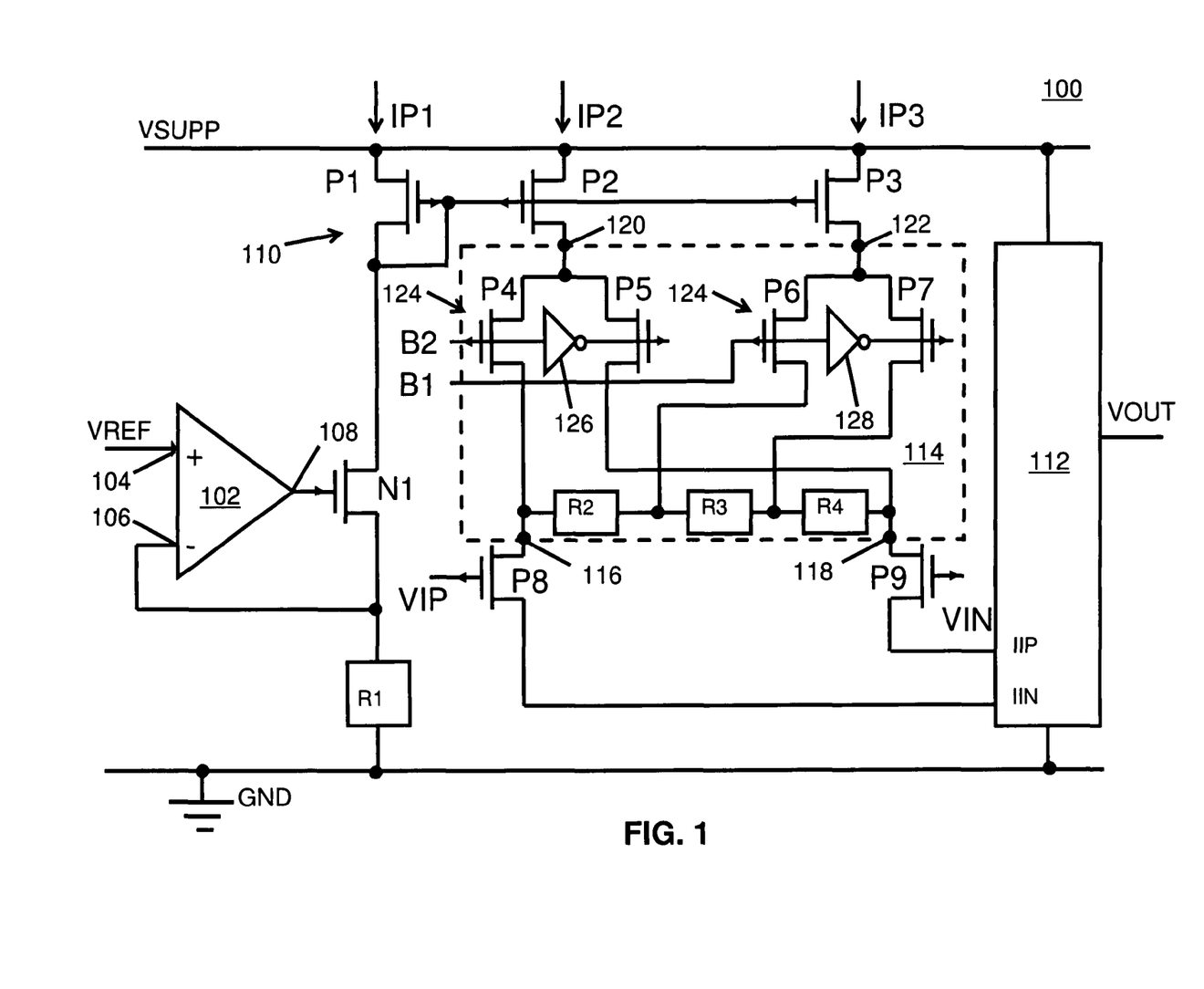
FIG. 1 is a schematic circuit diagram of a differential amplifier with offset voltage trimming in accordance with an embodiment of the present invention.

A differential amplifier with offset voltage trimming 100 in accordance with an embodiment of the present invention will now be discussed with reference to FIG. 1. In this embodiment, the differential amplifier with offset voltage trimming 100 comprises a current control amplifier 102 having a non-inverting input 104 that receives a reference voltage VREF, an inverting input 106 and an amplifier output 108. The amplifier output 108 is coupled to a gate of an NMOS current control transistor N1, and a source of the control transistor N1 is both coupled to the inverting input 106 and coupled through a current control resistor R1 to ground GND.

The differential amplifier with offset voltage trimming 100 has a current supply in the form of a current mirror circuit 110 that comprises one PMOS current regulating transistor P1, and two PMOS mirror transistors P2, P3. The current regulating transistor P1 couples a supply rail VSUPP to the drain of the current control transistor N1. The current regulating transistor P1 also has a gate and drain coupled together that are also coupled to gates of the mirror transistors P2, P3.

There is a differential current to voltage converter 112 having a positive current input node IIP, a negative current input node IIN and a voltage output node VOUT. In operation, the voltage output node VOUT provides an output voltage VOP that is proportional to the difference in current values flowing into the positive current input node IIP and a negative current input node IIN.

The differential amplifier with offset voltage trimming 100 further includes an offset voltage trimming circuit 114 that has a plurality of trimming control inputs B2, B1, two trimming outputs, namely a non-inverting trimming output 116 and an inverting trimming output 118. There are two trimming inputs 120, 122 coupled to the current supply in the form of the current mirror circuit 110. More specifically, one of the trimming inputs 120 is coupled to the supply rail VSUPP through mirror transistor P2 that provides a current IP2 to trimming inputs 120. The other one of the trimming inputs 122 is coupled to the supply rail VSUPP through mirror transistor P3 that provides a current IP3 to trimming inputs 120. The current supply, in the form of the current mirror circuit 110, can therefore be considered as providing a supply current IS comprising current IP2 and current IP3.

The offset voltage trimming circuit 114 has a plurality of trimming resistances R2, R3, R4 and a plurality of trimming selectors 124. The trimming selectors 124 provide for selectively connecting portions of the supply current IS, to the trimming outputs 116, 118 through none or alternatively through at least one of the trimming resistances R2, R3, R4. In this embodiment the trimming selectors 124 comprise a two parallel coupled transistor pairs. A first one of the parallel coupled transistor pairs is formed by a PMOS first transistor P4 and a PMOS second transistor P5. The gate of the first transistor P4 is directly coupled to trimming control input B2 and the gate of second transistor P5 is coupled through an inverter 126 to the trimming control input B2.

A second one of the parallel coupled transistor pairs is formed by a PMOS first transistor P6, and a second PMOS transistor P7. The gate of first transistor P6 is directly coupled to trimming control input B1 and the gate of second transistor P7 is coupled through an inverter 128 to the trimming control input B1. In operation, each of the transistor pairs have complementary functioning transistors such that when the first transistor (P4 or P6) is in a conductive state the second transistor (P5 or P7) is in a non-conductive state and when the second transistor (P5 or P7) is in a conductive state the first transistor (P4 or P6) is in a non-conductive state.

In this embodiment, the trimming resistances R2, R3, R2 couple the inverting trimming output 118 to the non-inverting trimming output 116. The trimming selectors 124 provide for selectively connecting portions of the supply current IS to each of the trimming outputs 116, 118 through none or alternatively through at least one of the trimming resistances.

As illustrated, the trimming resistances R2, R3, R4 have central trimming resistance R3 disposed centrally in series with other resistances R2 and R4. Typical resistance values for trimming resistances R2 and R4 are 10 KOhms and the rimming resistance R3 has a resistance value of 20 KOhms. Hence, the central trimming resistance R3 has a resistance value of at least twice the other resistances and in this embodiment R3=2*R2=2*R4.

Each trimming selector 124 is controllable by a bit of a trim code applied to a trimming control input (B1,B2) of each trimming selector 124. Also, each trimming selector 124 is coupled across an associated set of trimming resistors selected from the trimming resistors R2, R3, R4. For instance, the trimming selector coupled across the central trimming resistance R4 is controllable by a least significant bit B1 of the trim code and the trimming selector 124 coupled across all of the trimming resistances R2, R3, R4 is controllable by a most significant bit B2 of the trim code.

There is also a differential transistor pair formed by a PMOS inverting transistor P9 that couples one of trimming outputs (the inverting trimming output 118) to the positive current input node IIP. Also, a PMOS non-inverting transistor P8 couples another one of trimming outputs (the non-inverting trimming output 116) to the negative current input node IIN. The non-inverting transistor P8 has a gate (control electrode) providing a non-inverting differential input VIP and the inverting transistor P9 has a gate (control electrode) providing an inverting differential input VIN.

As illustrated, the second one of the parallel coupled transistor pairs, formed by transistors P6 and P7, is coupled across the central resistance R3. This therefore provides for selectively connecting a portion (IP3) of the supply current IS to either of the trimming outputs 116, 118. More by either selecting or bypassing the central resistance R3.

Also as illustrated, the first one of the parallel coupled transistor pairs, formed by transistors P4 and P5, is coupled across all of trimming resistances R2, R3, R4. This therefore provides for the selectively connecting of another portion (IP2) of the supply current IS to either of the trimming outputs 116,118 by a direct connection (by bypassing all trimming resistances R2, R3, R4) or by a connection through all of trimming resistances R2, R3, R4.

In operation the current control amplifier 102 controls the voltage at the gate of the current control transistor N1 such that a voltage across the current control resistor R1 (VR1) is equal to the reference voltage VREF. Hence, a current flowing through the current control resistor R1 (IR1)=VREF/R1=IP1=IP2=IP3; where IP1 is the current flowing through the current regulating transistor P1, IP2 is the current flowing through the mirror transistor P2 and IP3 is the current flowing through the mirror transistor P3. It will therefore be apparent that the supply current, comprising currents IP2 and IP3, can be controlled by the value of the reference voltage VREF and the current supply provides equal currents flowing into each one of the trimming inputs 120, 122. Also, it should be noted that the resistive temperature characteristics of R1, R2, R3 and R4 are the same so any increase in ambient temperature will affect all resistances equally.

Figure 2:
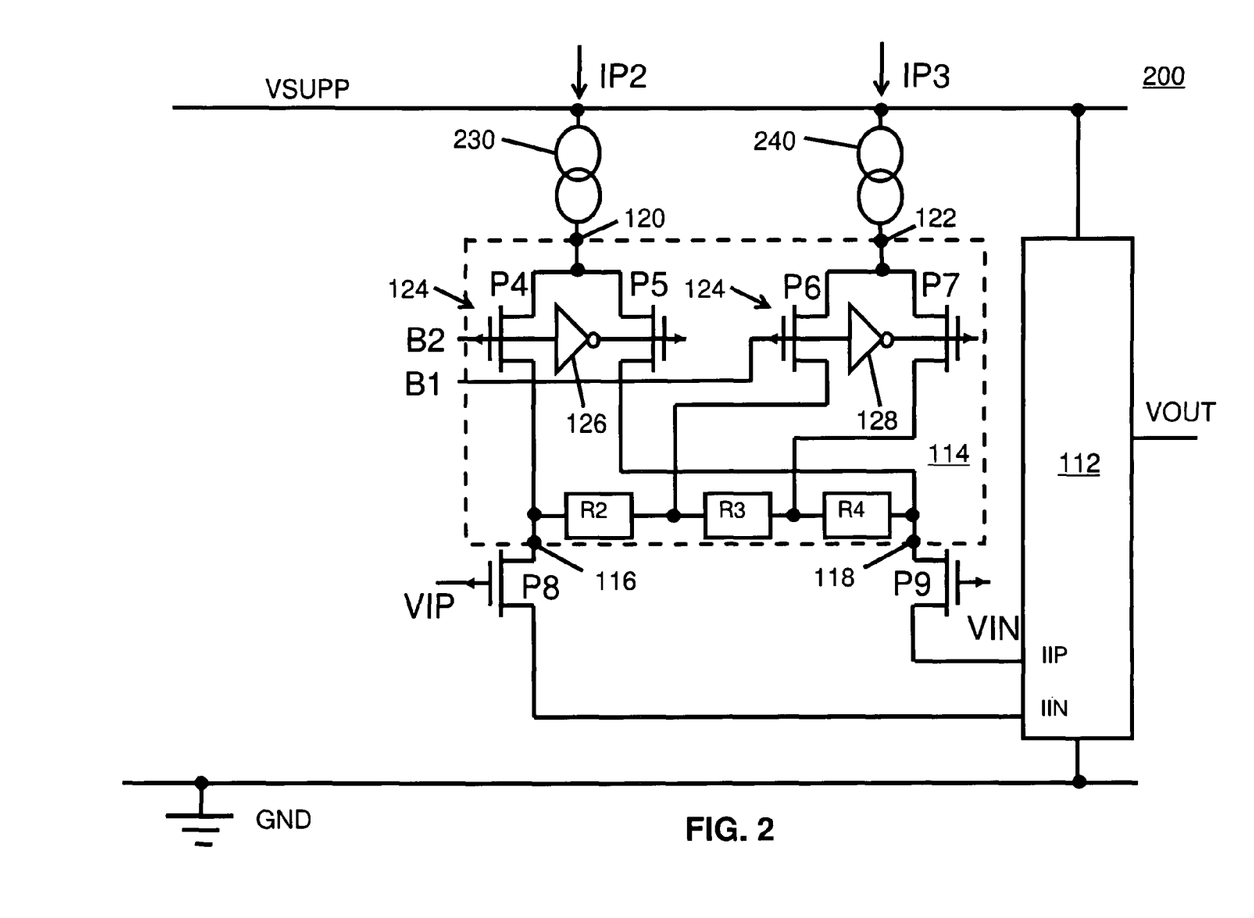
FIG. 2 is a schematic circuit diagram of a differential amplifier with offset voltage trimming in accordance with another embodiment of the present invention.

Referring to FIG. 2 there is illustrated a schematic circuit diagram of a differential amplifier with offset voltage trimming 200 in accordance with another embodiment of the present invention. As most of the circuitry has been described above with reference to FIG. 1, a repetitive description of this circuitry is not required for one of skill in the art to understand the invention and only the different will be described. In this embodiment the current mirror circuit 110, current control transistor N1, current control amplifier 102 and resistor R1 have been removed and replaced by two constant current sources 230 and 240. The constant current source 230 couples one of the trimming inputs 120 to the supply rail VSUPP and provides a constant current IP2 to the trimming input 120. Also, the constant current source 240 couples one of the trimming inputs 122 to the supply rail VSUPP and provides a constant current IP3 to the trimming input 122. Both constant current sources 230, 240 are identical. The combined currents IP2, IP3 form the supply current IS and currents IP2, IP3 provide constant currents to a respective one of the trimming inputs 120, 122.

Figure 3:
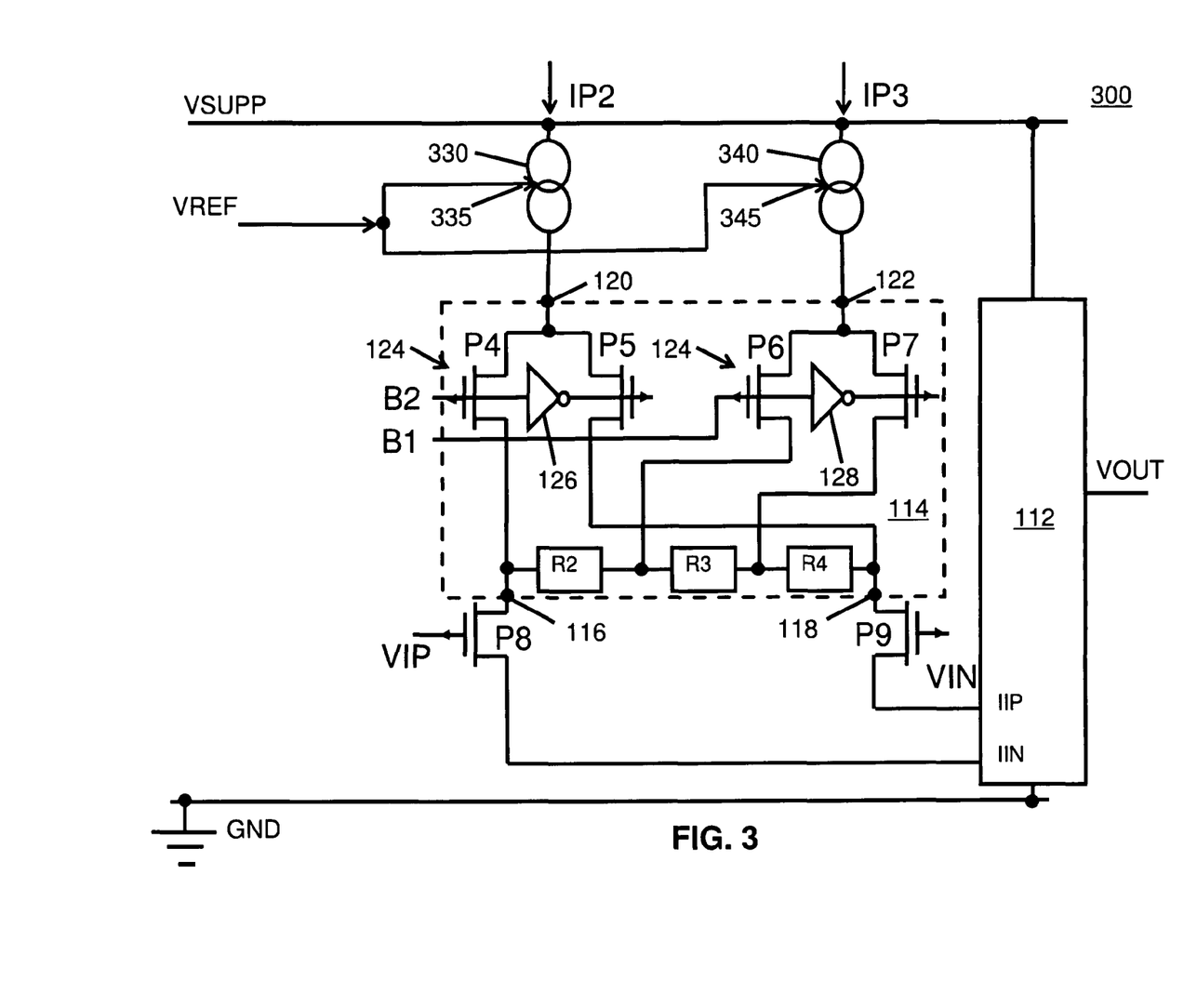
FIG. 3 is a schematic circuit diagram of a differential amplifier with offset voltage trimming in accordance with a further embodiment of the present invention.

Referring to FIG. 3 there is illustrated a differential amplifier with offset voltage trimming 300 in accordance with a further embodiment of the present invention. Again, as most of the circuitry has been described above with reference to FIGS. 1 and 2, a repetitive description of this circuitry is not required for one of skill in the art to understand the invention and only the different will be described. In this embodiment the two constant current sources 230 and 240 have been replaced with controllable constant current sources 330, 340. The controllable constant current source 330 couples one of the trimming inputs 120 to the supply rail VSUPP and provides a constant current IP2 to the trimming input 120. Also, the controllable constant current source 340 couples one of the trimming inputs 122 to the supply rail VSUPP and provides a controllable constant current IP3 to the trimming input 122. The constant current source 330 has a current source control input 335 and the constant current source 340 has a current source control input 345.

A reference voltage VREF is coupled directly to both of the controllable constant current sources 330, 340 and the value of the reference voltage VREF controls the constant current values provided by the controllable constant current sources 330, 340. In this embodiment, the controllable constant current sources 330, 340 are identical and the combined currents IP2, IP3 form the supply current IS. Furthermore, since the current source control inputs 335, 345 are coupled together the constant current sources 330, 340 therefore provide equal constant currents to a respective one of the trimming inputs 120, 122.

Figure 4:
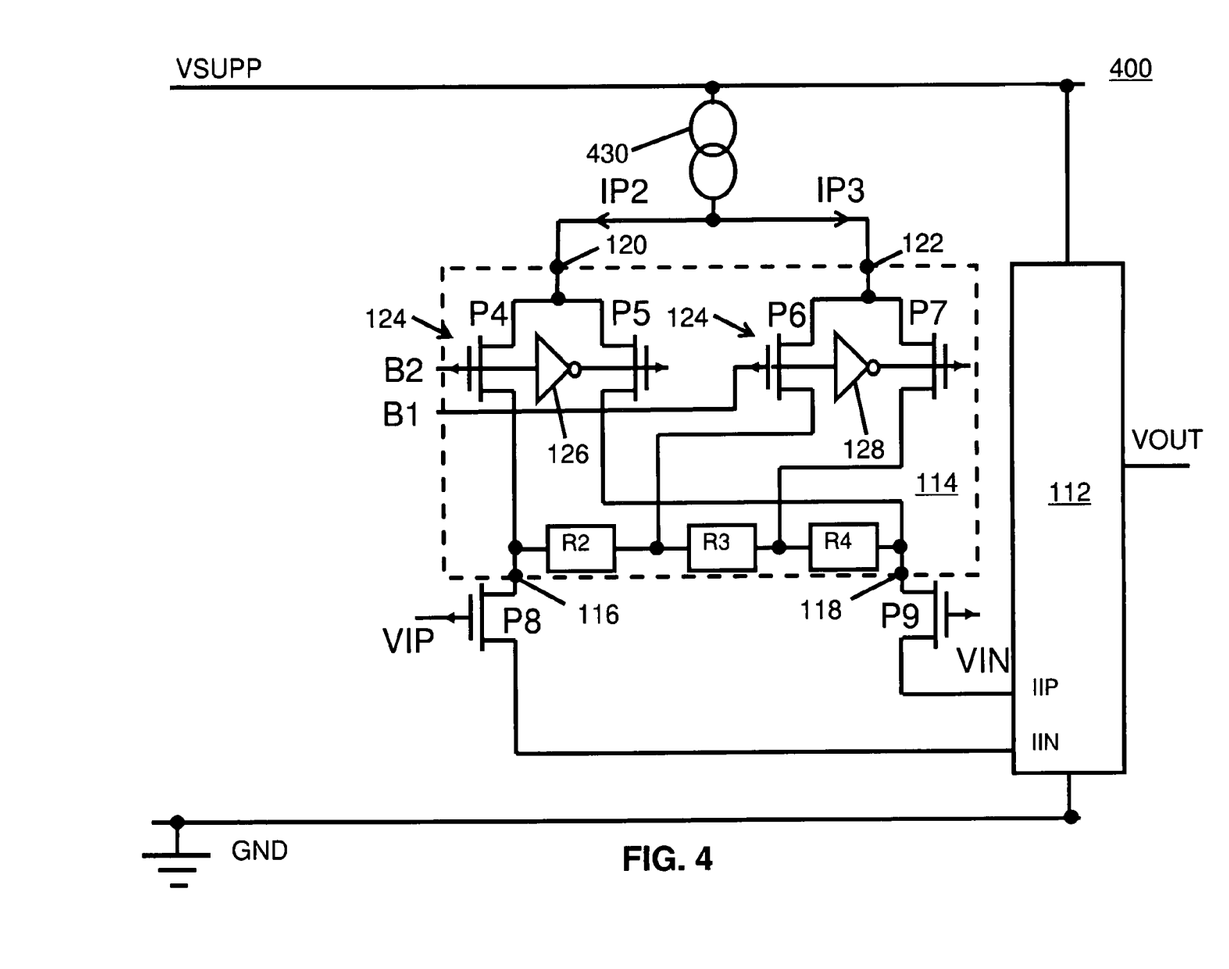
FIG. 4 is a schematic circuit diagram of a differential amplifier with offset voltage trimming in accordance with yet another embodiment of the present invention.

Referring to FIG. 4 there is illustrated a schematic circuit diagram of a differential amplifier 400 with offset voltage trimming in accordance with yet another embodiment of the present invention. Again as most of the circuitry has been described above with reference to FIGS. 1 and 2, a repetitive description of this circuitry is not required for one of skill in the art to understand the invention and only the different will be described. In this embodiment the two constant current sources 230, 240 are replaced with a single constant current source 430. The single constant current source 430 couples both of the trimming inputs 120, 122 to the supply rail VSUPP and provides constant currents IP2 and IP3 to the respective trimming input 120, 122. As will be apparent to a person of ordinary skill the single constant current source 430 could be replaced by a controllable constant current source as described above.

Figure 5:
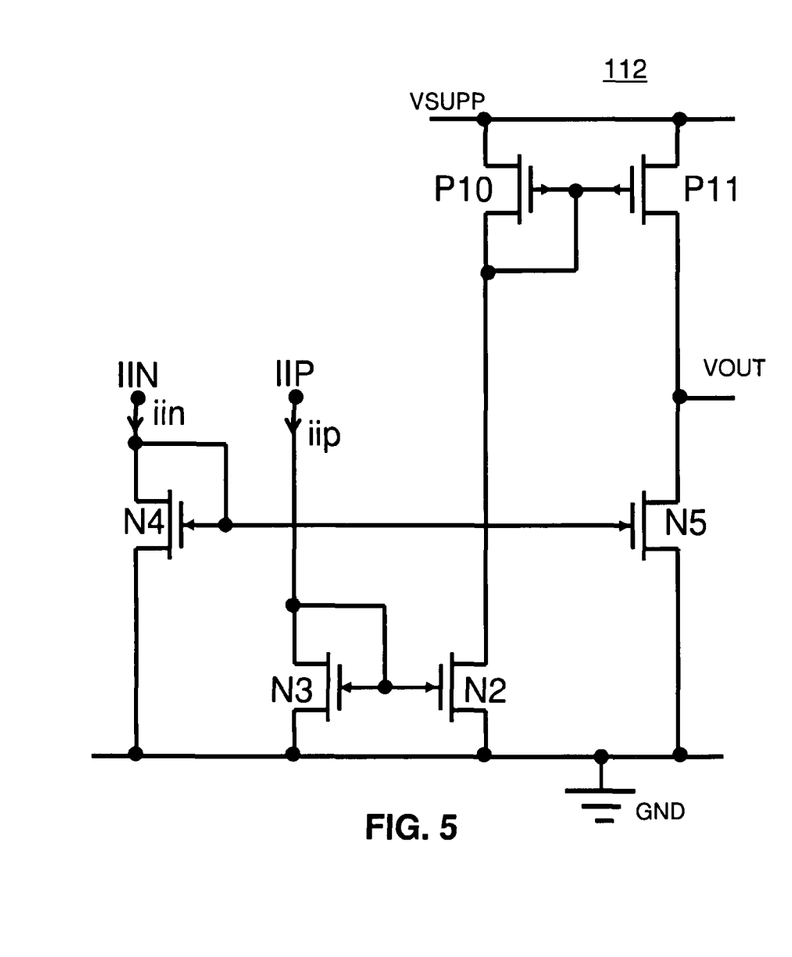
FIG. 5 is a schematic circuit diagram of an embodiment of a differential current to voltage converter that can be used in any of the embodiments of FIGS. 1 to 4.

In FIG. 5 there is illustrated a schematic circuit diagram of an embodiment of the differential current to voltage converter 112. As shown, the differential current to voltage converter 112 has a primary current mirror comprising two PMOS Transistors P10, P11 with their gates coupled together and their sources coupled to the supply rail VSUPP. The gate and drain of transistor are P10 coupled together, and the drain of transistor P10 is coupled to ground GND through an NMOS transistor N2 that forms a second current mirror with an NMOS transistor N3. The transistor N3 is connected between the positive current input node IIP and ground GND, and the gates of the transistors N2, N3 are coupled to each other and also coupled to the positive current input node IIP (which is also the drain of transistor N3). There is a third current mirror formed from NMOS transistors N4, N5 that have their gates coupled together and also coupled to the negative current input node IIN (which is also the drain of transistor N4). The transistor N4 is connected between the negative current input node IIN and ground GND and the transistor N5 is connected between the drain of transistor P11 and ground GND. Furthermore, the voltage output node VOUT is connected to the drain of transistor P11. In operation, the output voltage VOP at the voltage output node VOUT equal to (iip−iin)*Gc; where iip is the current flowing into the positive current input node IIP, iin is the current flowing into the negative current input node IIN, and Gc is the gain of the differential current to voltage converter 112.

Figure 6:
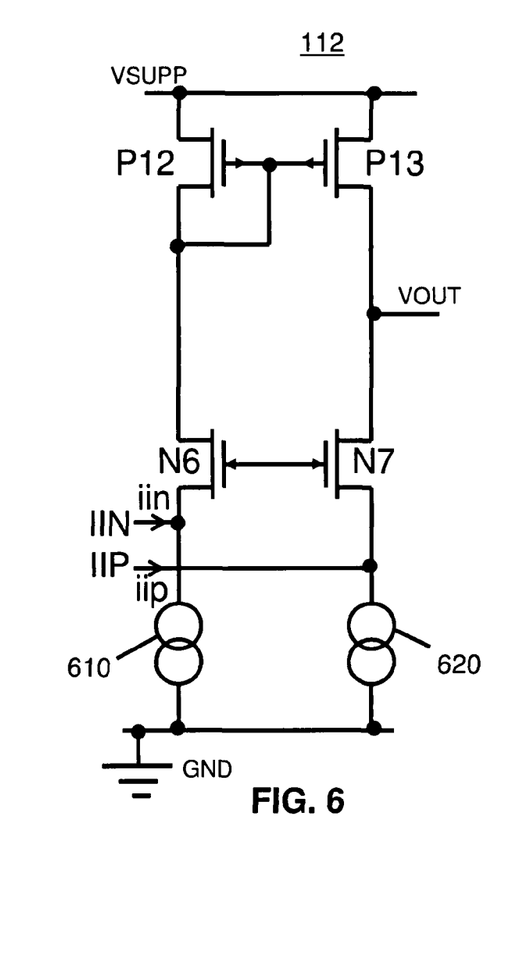
FIG. 6 is a schematic circuit diagram of another embodiment of a differential current to voltage converter that can be used in any of the embodiments of FIGS. 1 to 4.

In FIG. 6 there is illustrated a schematic circuit diagram of another embodiment of the differential current to voltage converter 112. As shown, the differential current to voltage converter 112 has a primary current mirror comprising two PMOS Transistors P12, P13 with their gates coupled together. Also, the sources of the Transistors P12, P13 are coupled to the supply rail VSUPP and the gate and drain of transistor are P12 coupled together. There are two NMOS transistors N6, N7 that have their gates coupled together. A first constant current source 610 is coupled between the source of transistor N6 and ground GND and a second constant current source 620 is coupled between the source of transistor N7 and ground. The drain of the transistor N6 is coupled to the drain of transistor P12 and the drain of the transistor N7 is coupled to the drain of transistor P13. The voltage output node VOUT is connected to the drain of transistor P13, the negative current input node IIN is connected to the source of transistor N6 and the positive current input node IIP is connected to the source of transistor N7. Again, in operation, the output voltage VOP at the voltage output node VOUT equal to (iip−iin)*Gc; where iip is the current flowing into the positive current input node IIP, iin is the current flowing into the negative current input node IIN, and Gc is the gain of the differential current to voltage converter 112.

Figure 7:
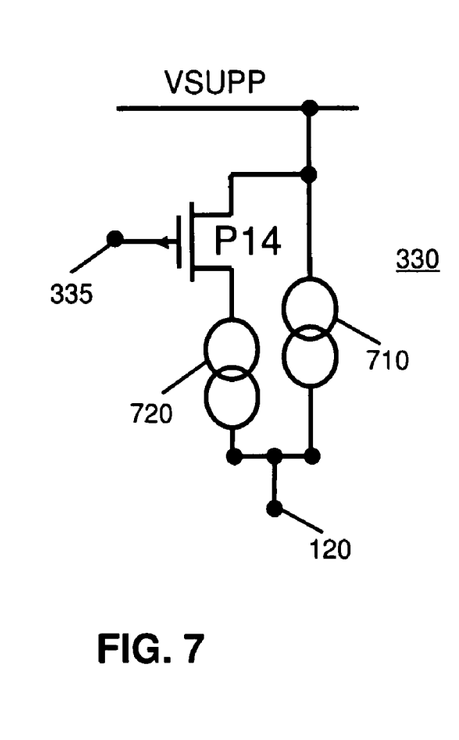
FIG. 7 is a schematic circuit diagram of an embodiment of a controllable constant current source for the embodiment of FIG. 3.

Referring FIG. 7 there is illustrated schematic circuit diagram of an embodiment the controllable constant current source 330 which is identical to the controllable constant current source 340. The controllable constant current source 330 includes an NMOS current source control transistor P14 with a gate that is the current source control input 335. The controllable constant current source 330 also has a directly coupled current source 710 coupling the supply rail VSUPP to the trimming input 120. Further, there is a selectable coupled current source 720 coupled to the trimming input 120 and coupled to the supply rail VSUPP through the current source control transistor P14. In operation, the reference voltage VREF controls the conductivity of the current source control transistor P14. Consequently, the reference voltage VREF controls the overall constant current supply value that is provided by the constant current source 330.

Figure 8:
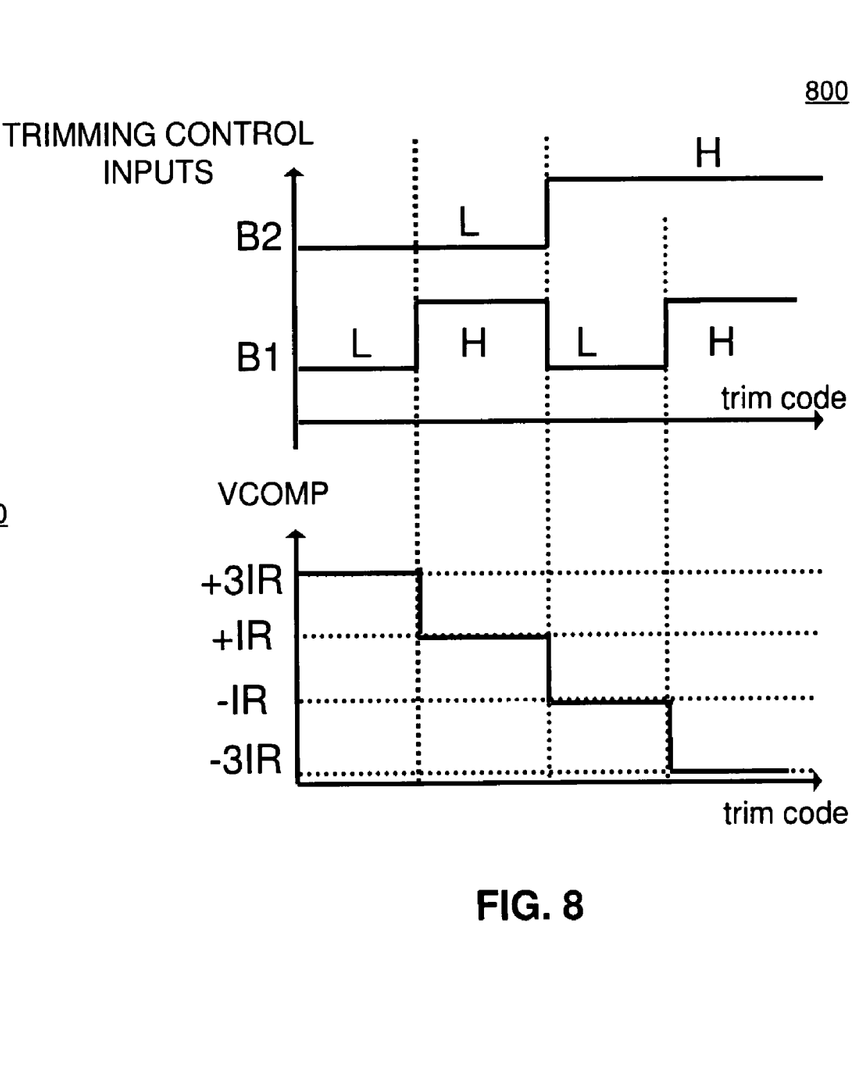
FIG. 8 illustrates graphs of trim code relationships with offset compensation voltage values for the embodiments of FIGS. 1 to 4.

Referring FIG. 8 there is illustrated graphs 800 of trim code relationships with offset compensation voltage values VCOMP for the embodiments of FIGS. 1 to 4. As shown, trimming control input B1 is a Least Significant Bit (LSB) and trimming control input B2 is a Most Significant Bit (MSB). Also, it will be understood that there is a feedback loop connecting the voltage output node VOUT to the differential inverting input VIN, thereby providing an input voltage VI to differential inverting input VIN. Also, an input voltage VP is supplied to the non-inverting input VIP, and for the graphs 800 the input voltage VP could typically be 1.5 Volts.

In operation, when the trimming control inputs B2, B1 are both set to zero, then all of IP3 flows through transistor P6, trimming resistances R3, R4, out of inverting output 118 and through the inverting transistor P9. Also, most of IP2 bypasses all the trimming resistances R2, R3, R4 and flows through transistor P4, out of the non-inverting output 116 and through the non-inverting transistor P8. However, a small portion X of IP2 flows through the trimming resistances R2, R3, R4. This small portion X=VR2/R2, where VR2 is the voltage across resistance R2. Consequently, IP2−VR2/R2 flows out of the non-inverting output 116 and through the non-inverting transistor P8. It can therefore be understood that the offset compensation voltage value VCOMP across the trimming resistors is +IP*(R3+R4), where IP=IP1+VR2/R2. Also, because R3=2*R4, then the offset compensation voltage value VCOMP=+IP*3*R (where R is a generic label equivalent to the value of R4 or R2). This offset compensation voltage value VCOMP is shown in FIG. 8 as +3IR for a trim code of B2, B1=0,0; where the input Voltage VP−the input voltage VI=VCOMP/G and where G is the gain of the differential amplifier with offset voltage trimming (100,200,300, 400).

When trimming control input B1 is set to 1 and B2 is set to zero, then all of IP3 flows through transistor P7, trimming resistance R4 and through the inverting transistor P9. Also, most of IP2 bypasses all the trimming resistances R2, R3, R4, out of the non-inverting output 116 and flows through the non-inverting transistor P8. However, a small portion X of IP2 flows through the trimming resistances R2, R3, R4. This small portion X=VR23/(R2+R3), where VR23 is the voltage across resistances R2 and R3. Consequently, IP2−VR23/(R2+R3) flows out of the non-inverting output 116 and through the non-inverting transistor P8. It can therefore be understood that the offset compensation voltage value VCOMP across the trimming resistors is +IP*R4=+IP*R, where IP=IP1+VR23/(R2+R3). This offset compensation voltage value VCOMP is shown in FIG. 8 as +1IR for a trim code of B2, B1=0,1.

When trimming control input B1 is set to zero and trimming control input B2 is set to 1, then all of IP3 flows through trimming resistance R2 and through the non-inverting transistor P8. Also, most of IP2 bypasses all the trimming resistances R2, R3, R4 and flows through transistor P5, out of the inverting output 118 and flows through the inverting transistor P9. However, a small portion X of IP2 flows through the trimming resistances R2, R3, R4. This small portion X=VR34/(R3+R4), where VR34 is the voltage across resistances R3 and R4. Consequently, IP2−VR34/(R3+R4) flows out of the inverting output 116 and through the inverting transistor P9. It can therefore be understood that the offset compensation voltage value VCOMP across the trimming resistors is −IP*R4=−IP*R, where IP=IP1+VR34/(R3+R4). This offset compensation voltage value VCOMP is shown in FIG. 8 as −1IR for a trim code of B2, B1=1,0.

For trimming control inputs B2, B1 both equal 1, then all of IP3 flows through trimming resistances R2, R3 and through the non-inverting transistor P8. Also, most of IP2 bypasses all the trimming resistances R2, R3, R4, out of the inverting output 118 and flows through the inverting transistor P9. However, a small portion X of IP2 flows through the trimming resistances R2, R3, R4. This small portion X=VR4/R4, where VR4 is the voltage across resistance R4. Consequently, IP2−VR4/R4 flows out of the inverting output 116 and through the inverting transistor P9. It can therefore be understood that the offset compensation voltage value VCOMP across the trimming resistors is −IP*(R2+R3)=−3*IP*R, where IP=IP1+VR4/R4. This offset compensation voltage value VCOMP is shown in FIG. 8 as −3IR for a trim code of B2, B1=1,1.

From the above, it will be apparent that the trimming selectors 124 provide for selectively connecting the current supply directly to the non-inverting trimming output 116 whilst selectively connecting the current supply to the inverting trimming output 118 through a first selected group (R3,R4) of the trimming resistances R2,R3,R4. The trimming selectors 124 further provide for selectively connecting the current supply to the inverting trimming output 118 through a subset (R4) of the first selected group (R3, R4). As an alternative selection, the trimming selectors 124 further provide for selectively connecting the current supply directly to the inverting trimming 118 output whilst selectively connecting the current supply to the non-inverting trimming output 116 through a second selected group (R3, R2) of the trimming resistances R2, R3, R4. Also, trimming selectors 124 further provide for selectively connecting the current supply to the non-inverting trimming output 116 through a subset (R2) of the second selected group (R3,R2).

Figure 9:
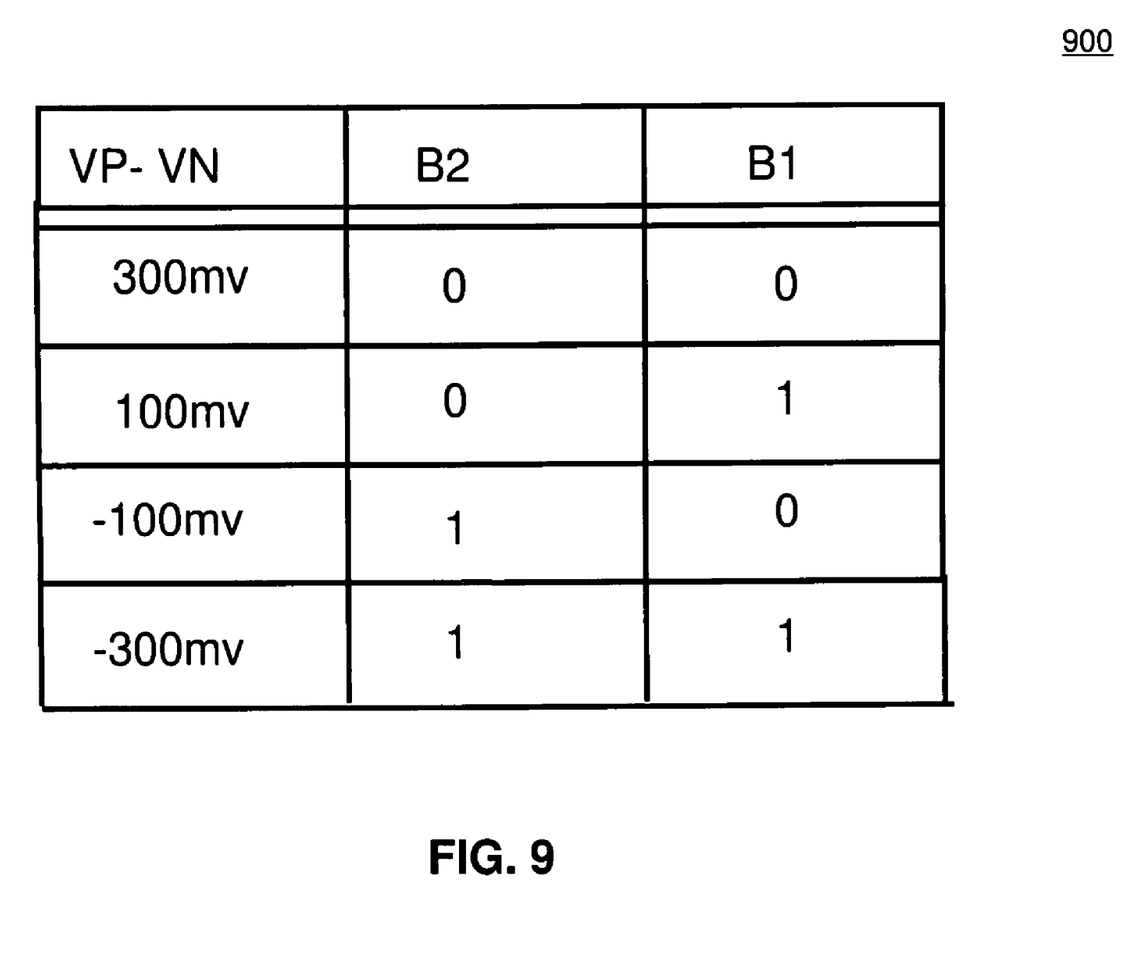
FIG. 9 illustrates a trim code look up table of trim code input values and corresponding offset voltage values for the embodiments of FIGS. 1 to 4.

In FIG. 9 there is illustrated a trim code look up table 900 of trim code input values B2,B1 and corresponding offset voltage values VP−VN for the embodiments of FIGS. 1 to 4. This look up table is specifically for when there is a feedback loop connecting the voltage output node VOUT to the differential inverting input VIN. Hence, it will be apparent that the input voltage VN is applied to the inverting input VIN and the input voltage VP can be suitably selected as required for a specific desired output voltage VOP. It should be noted that the trim code look up table 900 takes into account the gain G of the differential amplifier (100,200,300,400). As shown, an offset voltage value VP−VN of −300 mvolts can be trimmed by a trim code B2,B1=0,0. An offset voltage value VP−VN of −100 mvolts can be trimmed by a trim code B2,B1=0,1 and so on. Hence, when an offset voltage occurs, the trim code look up table 900 can be searched to identify the trim code that will result in the greatest decrease of offset voltage that provided by the offset voltage trimming circuit 114.

Figure 10:
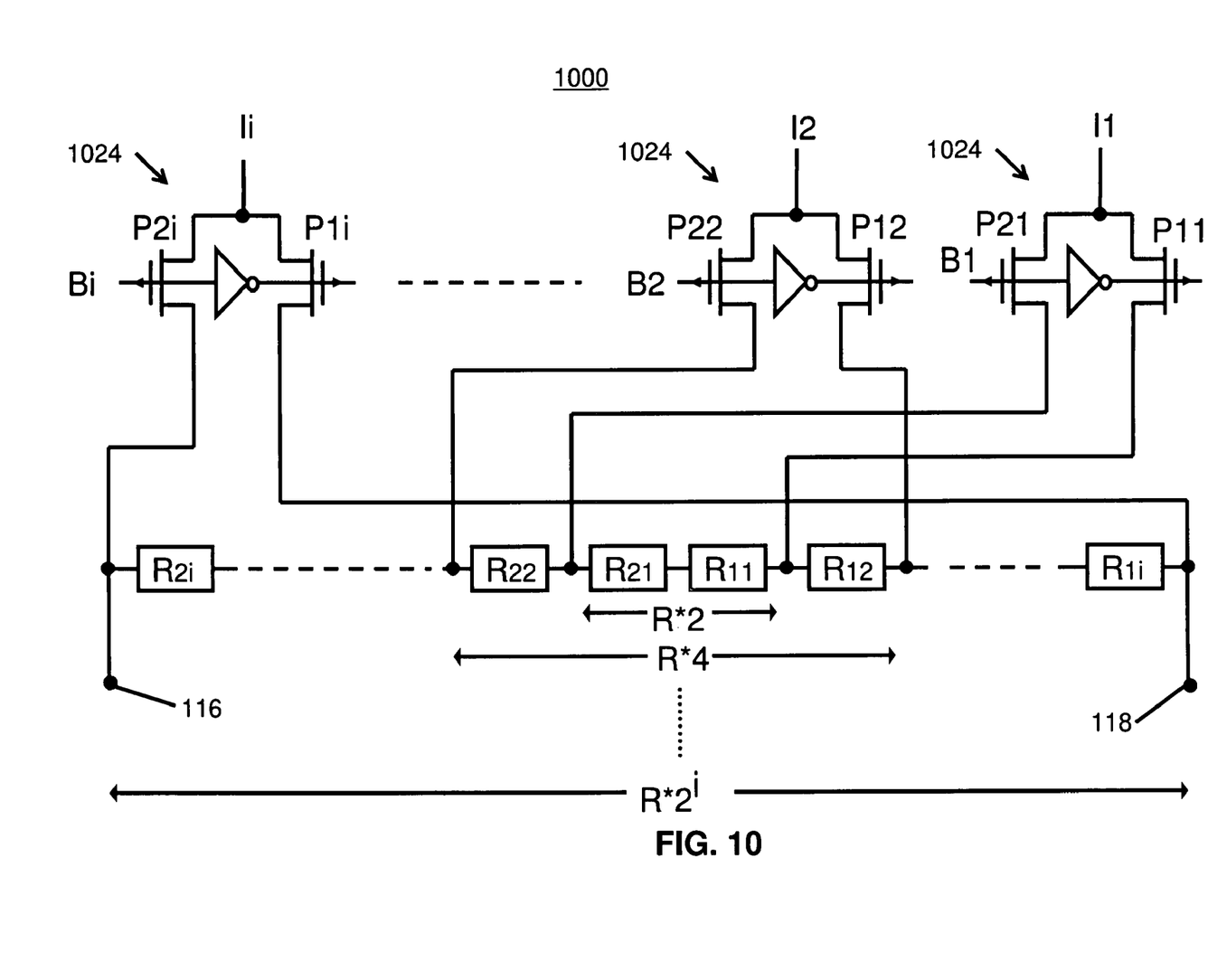
FIG. 10 is a schematic circuit diagram of an embodiment of a high resolution offset voltage trimming circuit that is an alternative embodiment of an offset voltage trimming circuit used in the embodiments of FIGS. 1 to 4.

Referring FIG. 10 there is illustrated schematic circuit diagram of a high resolution offset voltage trimming circuit 1000 that is an alternative embodiment of the offset voltage trimming circuit 114 used in the embodiments of FIGS. 1 to 4. As illustrated, there are i trimming selectors 1024, and corresponding trimming resistances formed by trimming resistors R11 to R1$i$ and R21 to R2$i$. It should be noted that a central trimming resistance is shown as two resistors R11, R21 for illustration purposes and in practice a single resistor would be used. Each of the trimming selectors 1024 is controllable by a bit of a trim code applied to a trimming control input of (B1−Bi) each trimming selector 1024. Each of the trimming selectors 1024 are identical and for instance one of the trimming selectors 1024 controllable by a MSB of the trim code comprises two complementary functioning PMOS transistors P2$i$,P1$i$, with a corresponding trimming control input Bi, supplied by a portion (Ii) of the supply current IS. Similarly, one of the trimming selectors 1024 controllable by a LSB of the trim code comprises two complementary functioning PMOS transistors P21,P11, with a corresponding trimming control input B1, supplied by a portion (I1) of the supply current IS.

Each trimming selector 1024 is coupled across an associated set the trimming resistors, selected from the trimming resistors R11 to R1$i$ and R21 to R2$i$. For instance, the trimming selector 1024 controllable by the MSB of the trim code is coupled across all of the trimming resistances. In contrast, the trimming selector 1024 controllable by the LSB of the trim code is coupled across all of the trimming resistances.

There is a specific binary ratio BR for each set of trimming resistors. Hence, for n=1 to i, an nth trimming selector 1024 will have an associated set of trimming resistors with a binary ratio $BR_n = R*2^n$. Thus binary ratio $BR_1$ for central trimming resistance R11,R21 associated with the 1st or LSB trimming selector 1024 is 2*R (where R is a resistance value of typically 10 KOhms). Also, the binary ratio $BR_i$ for all of the trimming resistance R11 to R1$i$ and R21 to R2$i$ associated with the Ith MSB trimming selector is $R*2^i$. The operation of high resolution offset voltage trimming circuit 1000 is similar to the offset voltage trimming circuit 114 and is therefore not described in detail. It will therefore be apparent that the trimming resistance R11, R21 has a resistance value of twice that of the immediately adjacent trimming resistance R22 or R21.

Figure 11:
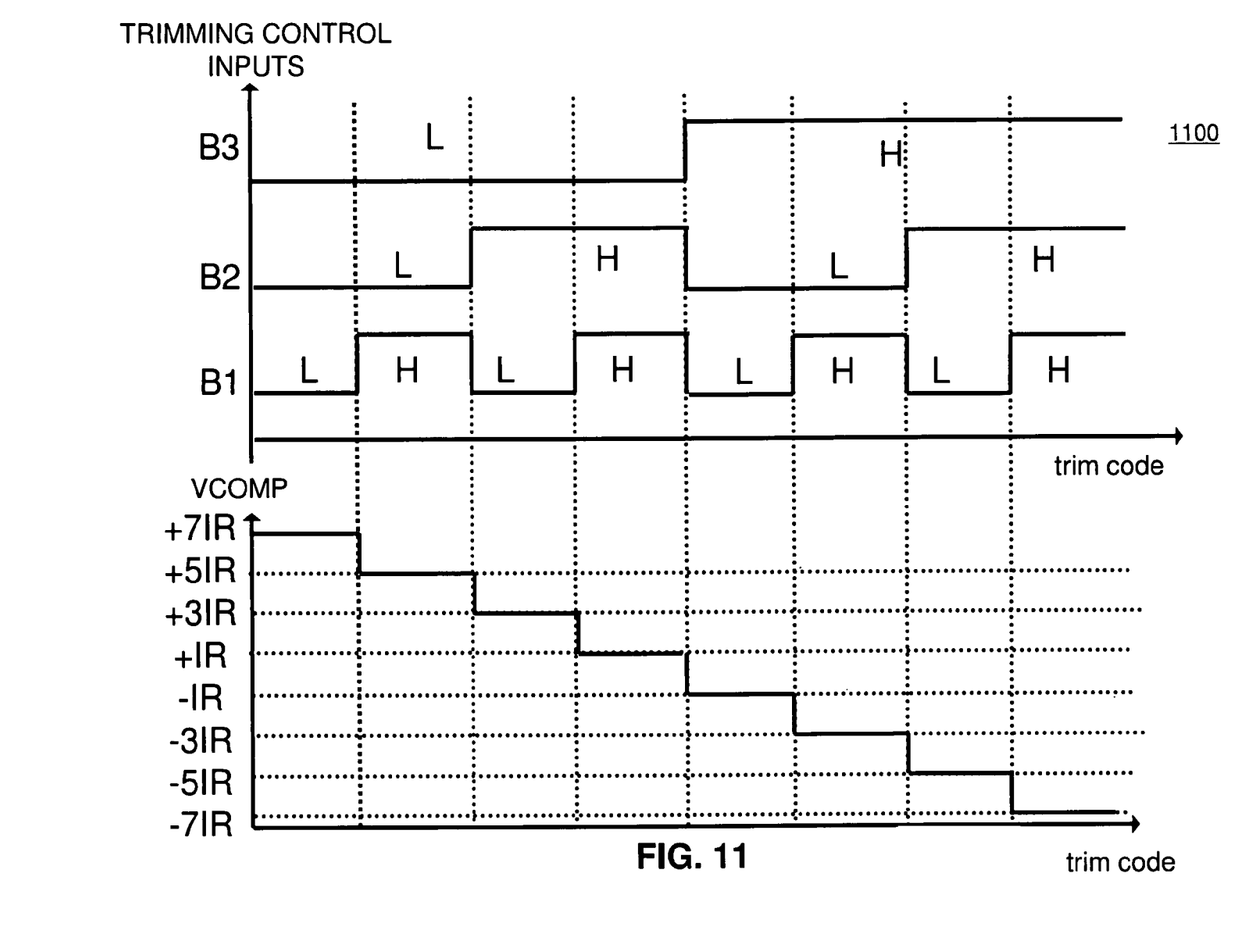
FIG. 11 illustrates exemplary graphs of trim code relationships with offset compensation voltage values for the high resolution offset voltage trimming circuit embodiment of FIG. 10.

FIG. 11 illustrates graphs 1100 of trim code relationships with offset compensation voltage values VCOMP for the high resolution offset voltage trimming circuit 1000. The graphs 1100 are for three trimming selectors (i=3) and therefore there are three trimming inputs B1,B2,B3. An analysis of the graphs 1100 is similar to that as described with reference to the graphs 800 of FIG. 8 and a repetitive explanation is therefore not required for one of skill in the art to understand the graphs 1100 and how a corresponding trim code look up table can be created.

Figure 12:
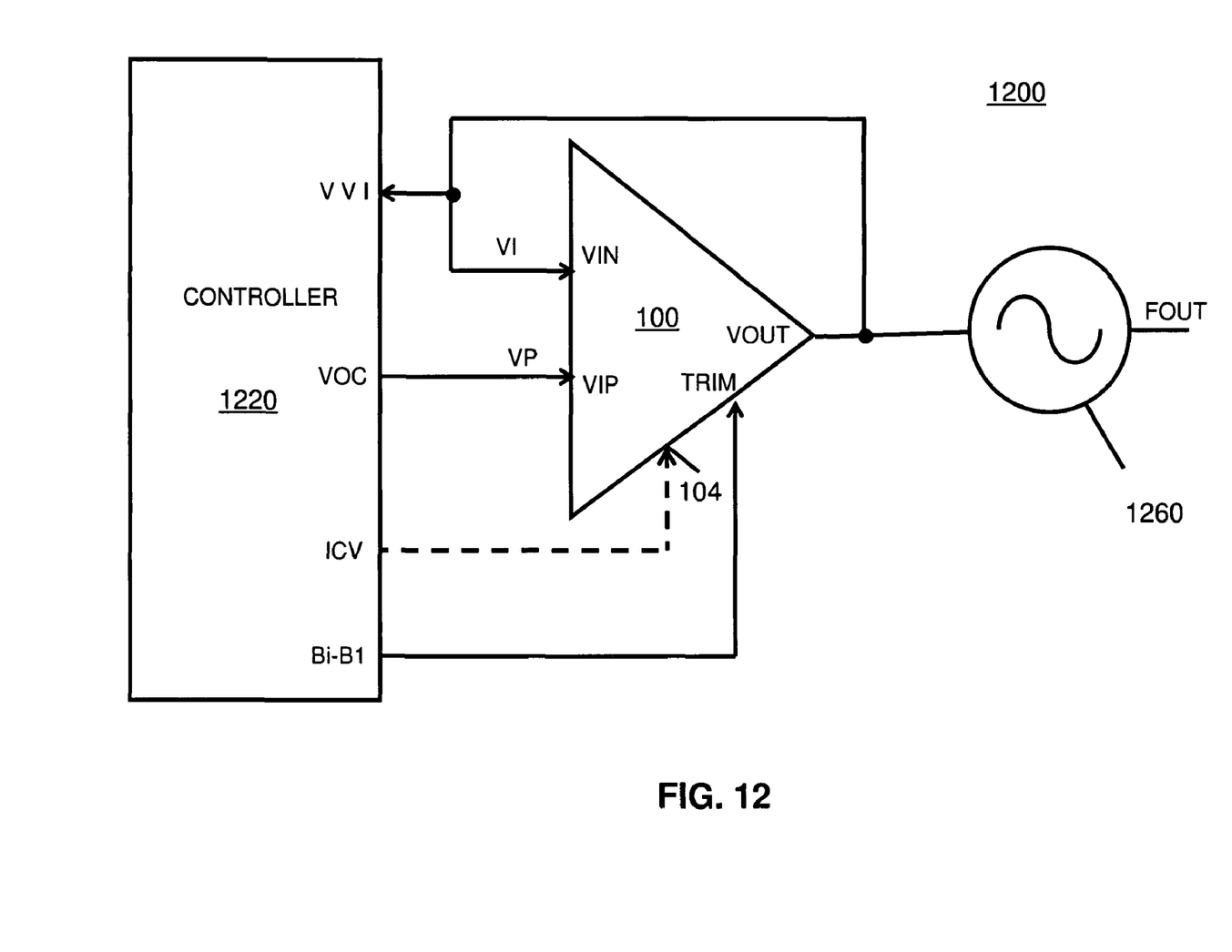
FIG. 12 is a schematic diagram illustrating a system comprising a controller coupled to the differential amplifier with offset voltage trimming of FIG. 1 when operating as a voltage follower controlling a voltage controlled oscillator.

Referring to FIG. 12 there is a schematic diagram illustrating a system 1200 comprising a controller 1220 coupled to the differential amplifier with offset voltage trimming 100. It will however be apparent to a person of skill in the art that that the differential amplifier with offset voltage trimming 100 can be replaced by any of the above embodiments. As shown, the differential amplifier with offset voltage trimming 100 is operating as a voltage follower controlling a voltage controlled oscillator 1240. As illustrated, the controller 1220 has a voltage control output VOC for providing an input voltage VP to the non-inverting differential input VIP, an i bit trim control output port Bi−B1 and an optional current control voltage output ICV. The i bit trim control output port Bi−B1 is coupled to a trim control input associated with trimming control inputs Bi−B1. Furthermore, the optional current control voltage output ICV supplies the reference voltage VREF to the non-inverting input 104 of the current control amplifier 102 to thereby set the value of the supply current IS. The controller 1220 also has a voltage value input VVI that is coupled to the differential inverting input VIN.

A feedback loop connects the voltage output node VOUT to the differential inverting input VIN, therefore the output voltage VOP is fed-back to the differential inverting input VIN. Accordingly, the output voltage VOP is the same as the input voltage VI at the inverting input VIN. Also, the voltage output node VOUT is coupled to a load, which in this embodiment (by way of example) is a Voltage Controlled Oscillator with an output FOUT.

Figure 13:
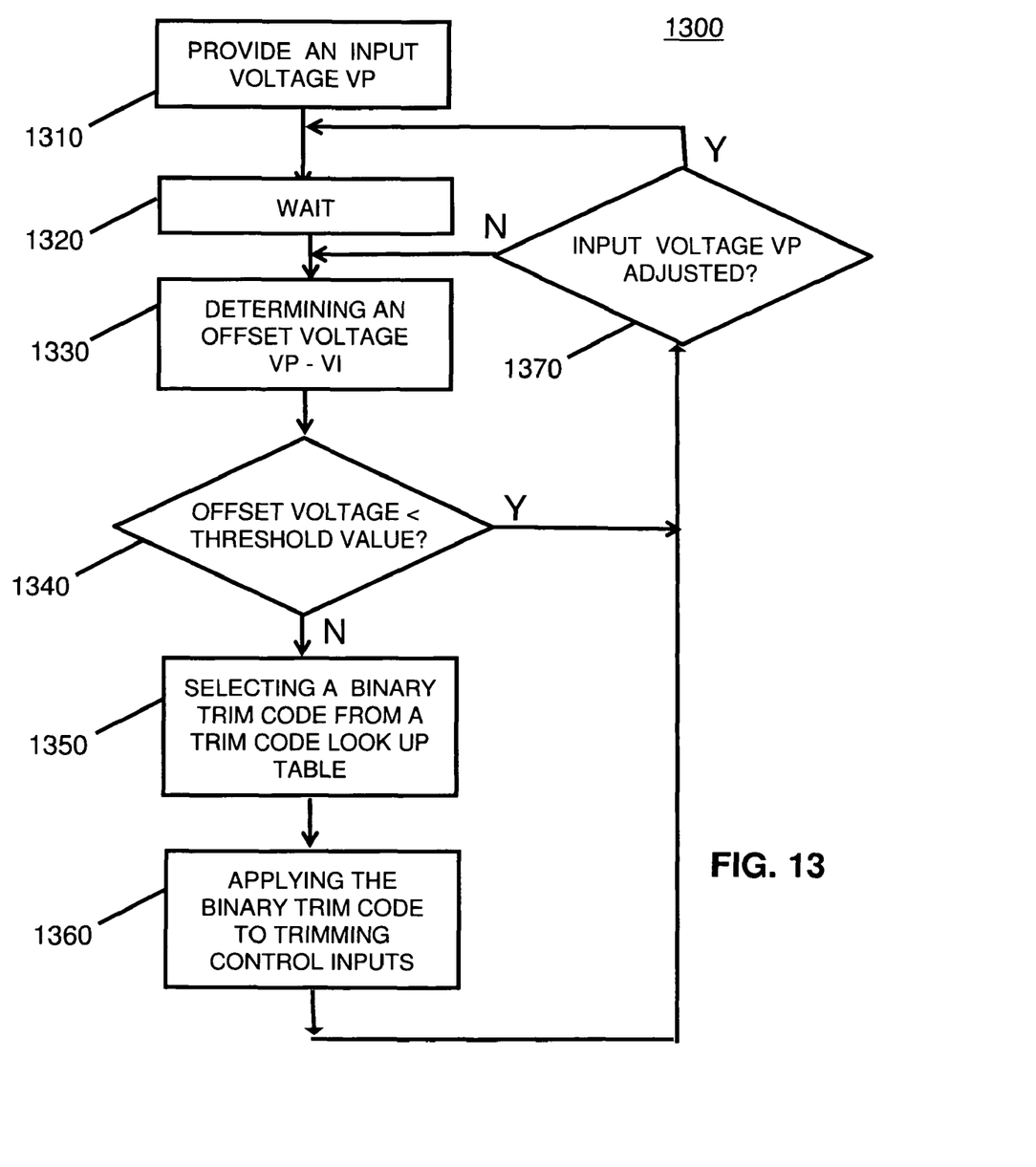
FIG. 13 is a flow chart illustrating a method for providing offset voltage trimming for the embodiment of FIG. 12.

The operation of the system 1220 is best described with reference to the FIG. 13. In FIG. 13 there is illustrated a flow diagram of a method 1300 for providing offset voltage trimming for the system 1220. The method 1300 starts at a providing block 1310 when the controller 1220 provides the input voltage VP to the non-inverting input VIP. At a wait block 1320 the controller 1220 waits typically for 500 mSeconds for the system to stabilized and thereafter, at a determining block 1330, the controller determines an offset voltage VOFFSET. The offset voltage is determined from the difference between the input voltage VP and input voltage VI (measured at the voltage value input VVI).

At a test block 1340, a test is conducted to determine if the offset voltage VOFFSET is less than a threshold value TV. For the trim code look up table 900, this threshold value TV should be selected to be 100 mV (since the resolution of VP−VN is in 200 mV steps in the look up table). If the offset voltage VOFFSET is less than the threshold value TV then the method 1300 goes to a test block 1370 as the system 1200 lacks the resolution to compensate (trim) such a small offset voltage VOFFSET. However, it will be appreciated that if the high resolution offset voltage trimming circuit 1000 is used then this resolution will be much greater. If the offset voltage VOFFSET not is less than the threshold value TV then a selecting block 1350 selects a binary trim code from the trim code look up table 900 that corresponds to the offset voltage VOFFSET. Typically the trim code look up table 900 is stored in the controller 1220, and at an applying block 1360, the controller 1220 applies the binary trim code to the trimming control inputs Bi−B1 to selectively connect portions of the supply current IS to each of the trimming outputs 116,118 through none or alternatively through at least one of the trimming resistances thereby reducing the offset voltage VOFFSET.

The method 1330 then goes to the test block 1370 to check if the if the input voltage VI has been adjusted (changed), if there is no change in the input voltage VI then the method 1300 returns directly to the determining block 1330. However, if there is a change in the input voltage VI, the method 1300 goes to the wait block 1320 before returning to the determining block 1330.

As is evident from the foregoing discussion, the present invention provides for trimming offset voltages occurring at the output of a differential amplifier. An offset voltage can simply be trimmed by selecting an appropriate trim code from the trim code look up table and applying the trim code to respective trimming control inputs B1–Bi. As will be apparent to one skilled in the art, the above embodiments may be implemented in any form of transistor technology such as Metal Oxide Semiconductor, using bipolar transistors or otherwise, as such throughout this specification the terms gate, source and drain can be readily substituted for base emitter and collector.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A differential amplifier with offset voltage trimming comprising:
    at least one current supply;
    a differential current to voltage converter having a positive current input node, a negative current input node and a voltage output node, wherein in operation the voltage output node provides an output voltage that is proportional to the difference in current values flowing into the positive current input node and a negative current input node;
    an offset voltage trimming circuit having a plurality of trimming control inputs, an inverting trimming output, a non-inverting trimming output and at least two trimming inputs coupled to the at least one current supply, the offset voltage trimming circuit further includes a plurality of trimming resistances coupling the inverting trimming output to the non-inverting trimming output, and a plurality of trimming selectors, controllable by a trim code provided to the trimming control inputs, provide for selectively connecting the current supply directly to the non-inverting trimming output whilst selectively connecting the current supply to the inverting trimming output through a first selected group of the trimming resistances; and
    a differential transistor pair formed by an inverting transistor that couples the inverting trimming output to the positive current input node and a non-inverting transistor that couples the non-inverting trimming output to the negative current input node.

2. The differential amplifier of claim 1, wherein the plurality of trimming selectors further provide for selectively connecting the current supply to the inverting trimming output through a subset of the first selected group.

3. The differential amplifier of claim 2, wherein the plurality of trimming selectors further provide for selectively connecting the current supply directly to the inverting trimming output whilst selectively connecting the current supply to the non-inverting trimming output through a second selected group of the trimming resistances.

4. The differential amplifier of claim 2, wherein the plurality of trimming selectors further provide for selectively connecting the current supply to the non-inverting trimming output through a subset of the second selected group.

5. The differential amplifier of claim 1, wherein in operation the at least one current supply provides equal and constant currents to the two trimming inputs.

6. The differential amplifier of claim 1, wherein the trimming selectors comprise a plurality of parallel coupled transistor pairs, each of the transistor pairs having a first transistor and a second transistor, wherein in operation when the first transistor is in a conductive state the second transistor is in a non-conductive state and when the second transistor is in a conductive state the first transistor is in a non-conductive state.

7. The differential amplifier of claim 6, wherein in operation, conductive states of the parallel coupled transistor pairs are controlled to provide a trimming offset voltage across the trimming resistances to compensate for any offset voltage caused by a difference in voltages at control electrodes of the differential transistor pair.

8. The differential amplifier of claim 1, wherein the trimming resistances include a central trimming resistance disposed centrally in series with other resistances, and wherein the central trimming resistance has a resistance value of twice that of the trimming resistances that are immediately adjacent thereto.

9. The differential amplifier of claim 8, wherein each trimming selector is controllable by a bit of a trim code applied to a trimming control input of each trimming selector and each trimming selector is coupled across an associated set of trimming resistors selected from the trimming resistors, and wherein the trimming selector coupled across the central trimming resistance is controllable by a least significant bit of the trim code and the trimming selector coupled across all of the trimming resistances is controllable by a most significant bit of the trim code.

10. The differential amplifier of claim 8, wherein there is a ratio $BR_n$ for each associated set of trimming resistors, wherein the ratio $BR_n$ for the central trimming resistance is $2*R$ and the ratio $BR_n$ for all of the trimming resistances is $R*2^n$ where R is a resistance value and n is the number of bits in the trim code.

11. A differential amplifier with offset voltage trimming comprising:
    at least one current supply for providing a supply current;
    a differential current to voltage converter having a positive current input node, a negative current input node and a voltage output node, the voltage output node providing an output voltage that is proportional to the difference in current values flowing into the positive current input node and a negative current input node;
    an offset voltage trimming circuit having a plurality of trimming control inputs, two trimming outputs and at least two trimming inputs coupled to the at least one current supply, the offset voltage trimming circuit further includes a plurality of trimming resistances coupling the inverting trimming output to the non-inverting trimming output, and a plurality of trimming selectors, controllable by a trim code provided to the trimming control inputs, provide for selectively connecting portions of the supply current to each of the trimming outputs through none or alternatively through at least one of the trimming resistances; and a differential transistor pair formed by an inverting transistor that couples one of trimming outputs to the positive current input node and a non-inverting transistor that couples another one of the trimming outputs to the negative current input node.

12. The differential amplifier of claim 11, wherein the trimming selectors comprise a plurality of parallel coupled transistor pairs, each of the transistor pairs having a first transistor and a second transistor, wherein in operation when the first transistor is in a conductive state the second transistor is in a non-conductive state and when the second transistor is in a conductive state the first transistor is in a non-conductive state.

13. The differential amplifier of claim 11, wherein the trimming resistances include a central trimming resistance disposed centrally in series with other resistances, and wherein the central trimming resistance has a resistance value of twice that of the trimming resistances that are immediately adjacent thereto.

14. The differential amplifier of claim 13, wherein each trimming selector is controllable by a bit of a trim code applied to a trimming control input of each trimming selector and each trimming selector is coupled across an associated set of trimming resistors selected from the trimming resistors, and wherein the trimming selector coupled across the central trimming resistance is controllable by a least significant bit of the trim code and the trimming selector coupled across all of the trimming resistances is controllable by a most significant bit of the trim code.

15. The differential amplifier of claim 13, wherein there is a ratio $BR_n$ for each associated set of trimming resistors, wherein the ratio $BR_n$ for the central trimming resistance is $2*R$ and the ratio $BR_n$ for all of the trimming resistances is $R*2^n$ where R is a resistance value and n is the number of bits in the trim code.

16. A method for providing offset voltage trimming for a differential amplifier comprising an offset voltage trimming circuit having two trimming outputs coupled to respective transistors forming a differential transistor pair and two trimming inputs coupled to the at least one current supply, the differential amplifier further comprising a plurality of trimming resistances for selectively coupling the two trimming outputs to the current supply, a plurality of trimming control inputs, a non-inverting input, an inverting input and a voltage output node coupled to the inverting input, the method comprising:

providing an input voltage to the non inverting input;

determining an offset voltage from a difference between the control voltage and a feedback voltage at the inverting input;

selecting a binary trim code from a trimming code look up table that corresponds to the offset voltage; and applying the binary trim code to the trimming control inputs to selectively connect portions of the supply current to each of the trimming outputs through none or alternatively through at least one of the trimming resistances thereby reducing the offset voltage.

17. The method for providing offset voltage trimming for a differential amplifier of claim 16, wherein the differential amplifier further includes a differential current to voltage converter having a positive current input node coupled, by a transistor of the differential transistor pair, to one of the trimming outputs and a negative current input node coupled, by another transistor of the differential transistor, to another one of the trimming outputs, and wherein an output of the differential current to voltage converter is the voltage output node that provides an output voltage that is proportional to the difference in current values flowing into the positive current input node and a negative current input node.

18. The method for providing offset voltage trimming for a differential amplifier of claim 17, wherein the trimming outputs are an inverting trimming output and an non-inverting trimming output, and wherein the applying the binary trim code to the trimming control inputs is further characterized by selectively connecting a portion of the supply current directly to the non-inverting trimming output whilst selectively connecting another portion of the supply current to the inverting trimming output through a first selected group of the trimming resistances.

19. The method for providing offset voltage trimming for a differential amplifier of claim 18, wherein the applying the binary trim code to the trimming control inputs is further characterized by selectively connecting the supply current to the inverting trimming output through a subset of the first selected group.

20. The method for providing offset voltage trimming for a differential amplifier of claim 19, wherein the applying the binary trim code to the trimming control inputs is further characterized by selectively connecting the supply current to the inverting trimming output whilst selectively connecting the current supply to the non-inverting trimming output through a second selected group of the trimming resistances.

* * * * *